United States Patent [19]

Miyamoto et al.

[11] Patent Number: 5,898,335
[45] Date of Patent: Apr. 27, 1999

[54] HIGH VOLTAGE GENERATOR CIRCUIT

[75] Inventors: Junichi Miyamoto, Yokohama; Shigeru Atsumi, Tokyo; Yasuo Itoh, Kawasaki, all of Japan

[73] Assignee: Kabushiki Kaisha Toshiba, Kawasaki, Japan

[21] Appl. No.: 08/754,795

[22] Filed: Nov. 21, 1996

Related U.S. Application Data

[63] Continuation of application No. 08/584,732, Jan. 11, 1996, Pat. No. 5,642,072, which is a continuation of application No. 08/212,920, Mar. 15, 1994, abandoned.

[30] Foreign Application Priority Data

Mar. 15, 1993 [JP] Japan ................... 5-078533

[51] Int. Cl.$^6$ ........................................ G05F 3/02
[52] U.S. Cl. .................. 327/535; 327/311; 327/313; 327/314; 327/321; 327/328; 327/537
[58] Field of Search .................. 327/310, 311, 327/313, 314, 321, 326, 328, 536, 537, 541, 543, 531, 352, 535, 584

[56] References Cited

U.S. PATENT DOCUMENTS

| | | |
|---|---|---|
| 3,829,717 | 8/1974 | Harrison ................... 327/584 |
| 4,656,369 | 4/1987 | Lou ........................ 327/536 |
| 4,904,885 | 2/1990 | Yamada et al. ............ 327/537 |
| 5,029,282 | 7/1991 | Ito ......................... 327/536 |
| 5,079,455 | 1/1992 | McCafferty et al. ....... 327/328 |
| 5,180,928 | 1/1993 | Choi ....................... 327/541 |
| 5,347,185 | 9/1994 | Tailliet ................... 327/326 |

*Primary Examiner*—Terry Cunningham
*Attorney, Agent, or Firm*—Banner & Witcoff, Ltd.

[57] ABSTRACT

A high voltage generator circuit comprises a boosting circuit, limiter circuit, and a bypass circuit. When a supply voltage is inputted into the boosting circuit, a high voltage is generated and supplied to the limiter circuit. When the high voltage generated by the boosting circuit exceeds a limit voltage of the limiter circuit, the limiter circuit operates and the output voltage of the boosting circuit is thus maintained at a constant value. When the output voltage exceeds the limit voltage of the limiter circuit and an output current of the boosting circuit exceeds a reference value, a portion of the output current of the boosting circuit equivalent to a difference between the output current and a predetermined value is bypassed and discharged by the bypass circuit stated above.

36 Claims, 6 Drawing Sheets

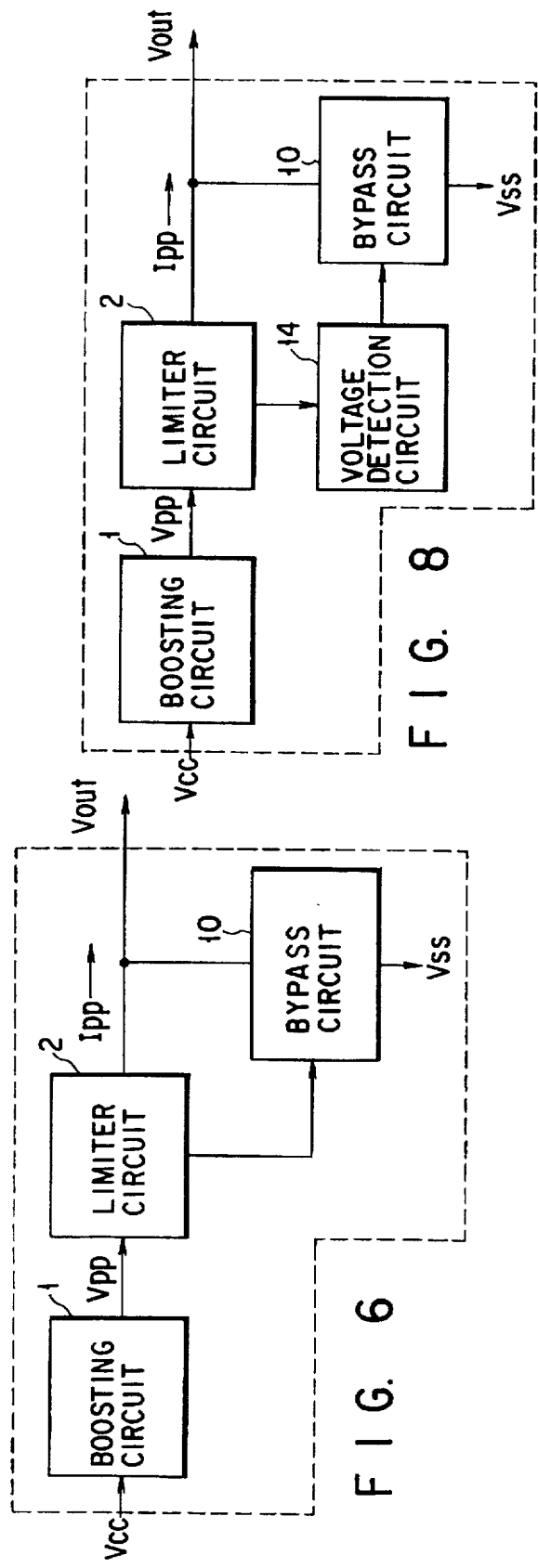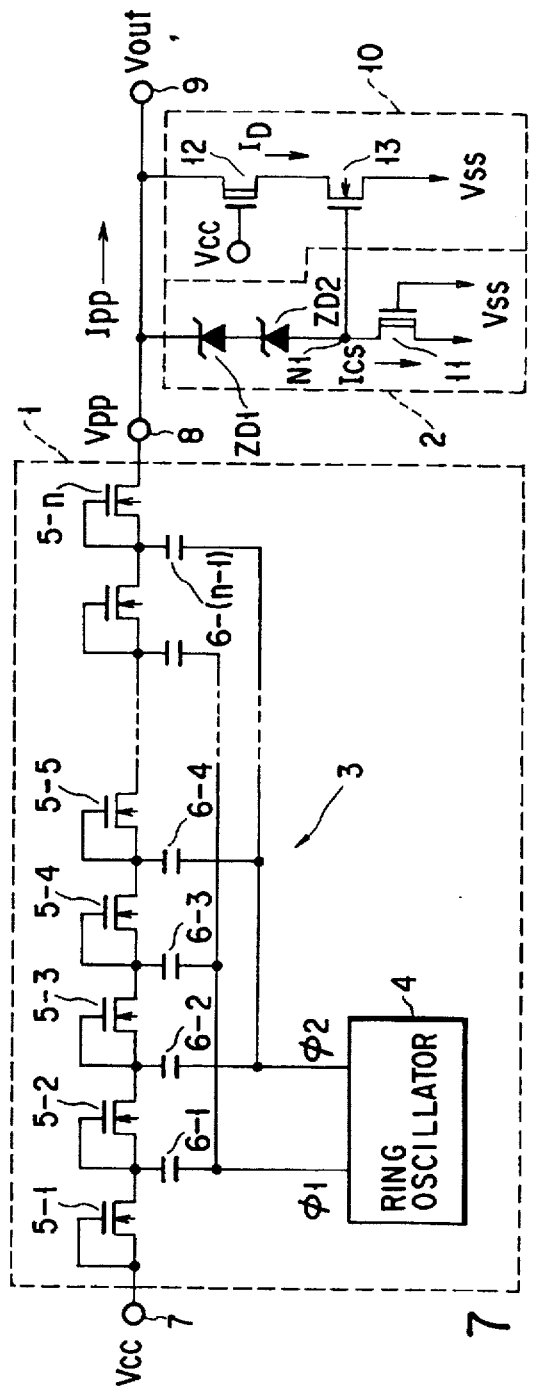

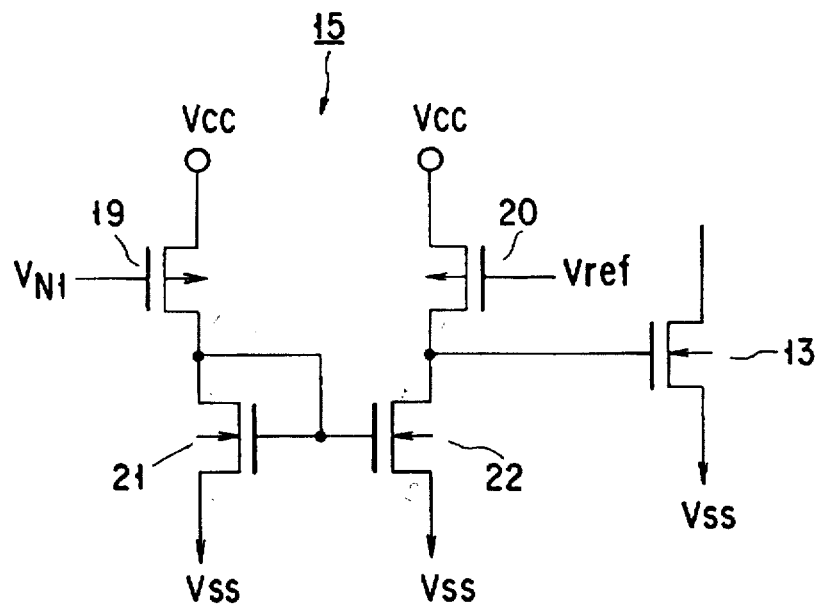
F I G. 10
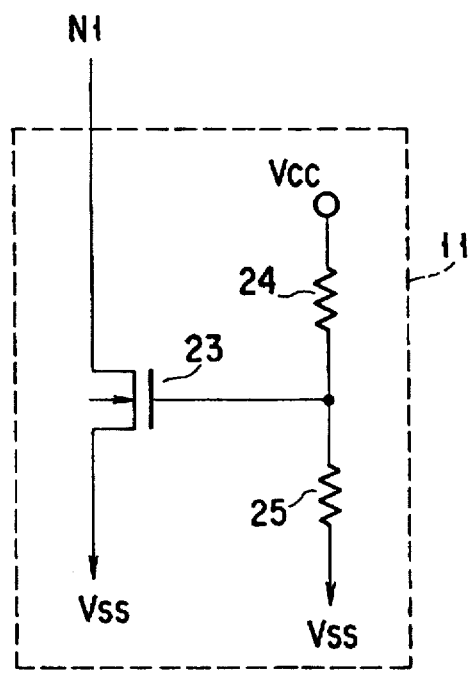
F I G. 12
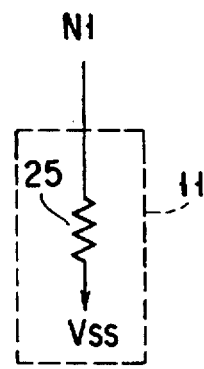
F I G. 13

HIGH VOLTAGE GENERATOR CIRCUIT

This application is a continuation of application Ser. No. 08/584,732, filed Jan. 11, 1996 now U.S. Pat. No. 5,647,072, which is a continuation of Ser. No. 08/212,920, filed Mar. 15, 1994, now abandoned.

BACKGROUND OF THE INVENTION

1. Field of the Invention

The present invention relates to a high voltage generator circuit included in a semiconductor device such as a non-volatile semiconductor memory, and particularly, to an improvement in a limiter for stabilizing an output potential, provided in a high voltage generator circuit.

2. Description of the Related Art

In an EPROM (Electric Programmable Read Only Memory), that data is generally written by injecting electrons having a higher energy (called hot electrons) among those electrons which are flowing between a source and a drain, into a floating gate, with high voltages of approximately 12.5 V and 8 V being respectively applied to a control gate and a drain of a memory cell. Therefore, a high power supply for supplying a voltage of 12.5 V is required in addition to a power supply for 5 V. Meanwhile, in case of an EEPROM (Electrically Erasable Programmable Read Only Memory) called a flash EEPROM which is capable of flash-erasing (or block-erasing) data, a high voltage generator circuit is provided in a chip, so that this type of EEPROM operates with single power supply of 5 V. In a flash EEPROM, although a high voltage of approximately 20 V must be applied when data is erased or written, an F-N (Fowlor Nordheim) current which flows when data is erased or written is so small that an internal high voltage generator circuit which can be included in a chip and which has only a small current capacity is sufficient for erasing or writing data.

FIG. 1 schematically shows an example of an arrangement of a conventional high voltage generator circuit which is included in a semiconductor device operated with a single power supply as stated above. This high voltage generator circuit comprises a boosting circuit 1 and a limiter circuit 2. For example, a supply voltage Vcc of 5 V is inputted into the boosting circuit 1 from an external power supply, and is then boosted by the circuit to generate a high voltage Vpp. The high voltage vpp thus generated is inputted into the limiter circuit 2 to stabilize the level of the voltage, and thereafter, a high voltage of 20 V is outputted from the limiter circuit 2, for example. The parasitic capacitance Cp of the load connected at node 9 and/or the parasitic capacitance of element 2 serves to stabilize the level of the output voltage.

FIG. 2 specifically shows an example of the arrangement of the high voltage generator circuit shown in FIG. 1. The boosting circuit 1 consists of a charge pump circuit 3 and a ring oscillator 4. The limiter circuit 2 consists of Zener diodes ZD1 and ZD2. The above charge pump circuit 3 consists of MOS transistors 5-1 to 5-n whose drains and gates are connected with each other and capacitors 6-1 to 6-(n−1). A current path of the MOS transistors 5-1 to 5-n is formed in series between a terminal 7 supplied with a supply voltage Vcc and another terminal 8 which outputs a boosted high voltage Vpp. The points connecting the MOS transistors 5-1 to 5-n with each other on the current path are respectively connected with electrodes of the capacitor 6-1 to 6-(n−1). The other electrodes of the capacitors 6-1, 6-3, ... are supplied with a clock pulse $\phi 1$ as shown in FIG. 3 outputted from a ring oscillator 4, while the other electrodes of the capacitors 6-2, 6-4, ... are supplied with a clock pulse $\phi 2$ as shown in FIG. 3 outputted from the ring oscillator 4.

The cathode and anode of the Zener diode ZD1 stated above are respectively connected to a terminal 8 and the cathode of the Zener diode ZD2. The anode of the Zener diode ZD2 is connected to a ground Vss. Each of the Zener diodes ZD1 and ZD2 is supplied with a voltage of 5 to 10 V. These Zener diodes ZD1 and ZD2 may be substituted with other kinds of diodes. The total number of Zener diodes or other diodes and the brakedown voltages thereof are determined in accordance with an output voltage vout to be outputted.

The above terminal 8 is connected to an output terminal 9. An output voltage Vout having a stabilized level is outputted from the output terminal 9.

In the arrangement as stated above, charges are sequentially transferred from a power supply Vcc through a current path connecting MOS transistors 5-1 to 5-n with each other, in synchronization with clock pulses $\phi 1$ and $\phi 2$ supplied from the ring oscillator 4, and a high voltage vpp is outputted to the terminal 8 by a charge pump. When the high voltage vpp thus outputted is higher than a sum of Zener voltages of Zener diodes ZD1 and ZD2, these Zener diodes ZD1 and ZD2 are broken down to lower the level of the voltage at the terminal 8. The output level of the voltage outputted from boosting circuit 1 is thus stabilized and outputted as an output voltage Vout from the terminal 9.

In case of a high voltage generator circuit shown in FIG. 2, the current (Ipp) supply ability is proportional to a product of a high level voltage V of clock pulses $\phi 1$ and $\phi 2$, a oscillation frequency f of the ring oscillator 4, and a capacity C of each capacitor 6-1 to 6-(n−1), i.e., "f·C·V". Consequently, in order to increase the current Ipp (charge pump current), it is sufficient to increase the oscillation frequency f of the ring oscillator 4, the electric potential of clock pulses $\phi 1$ and $\phi 2$, or the capacity C of each capacitor 6-1 to 6-(n−1). Assume that the above clock pulses $\phi 1$ and $\phi 2$ are generated by the ring oscillator 4 which is included in a semiconductor device and operated with a supply voltage vcc. Then, a relation of "Ipp=f·C·Vcc" is obtained since the electric potential V is equivalent to the supply voltage Vcc. Since the oscillation frequency f is proportional to the supply voltage Vcc, the charge pump current Ipp is also proportional to a value of $Vcc^2$. FIG. 4 shows a relationship between the supply voltage Vcc and the charge pump current Ipp.

The supply voltage Vcc, however, changes under influences of operations of various circuits, for example, by approximately ±0.5 V when the supply voltage Vcc is 5 V. Since the charge pump current Ipp is proportional to the value of $Vcc^2$, as has been explained before, the charge pump current Ipp greatly changes when the supply voltage Vcc changes.

In general cases, a zener diode has a characteristic as shown in FIG. 5. More specifically, a Zener diode has a characteristic that a voltage Vz applied to a cathode of the zener diode is significantly dependent on a current Iz flowing between the cathode and anode thereof when the voltage Vz is higher than the breakdown voltage of the Zener diode. It is also well-known that the value of the current Iz tends to be undesirably changed under influences of manufacturing process. In addition, since the uppermost value of the current Iz is limited, the Zener diode cannot regularly function when the voltage Vz is greatly changed. Therefore, a limiter circuit 2 having an arrangement of FIG. 2 where Zener diodes ZD1 and ZD2 are connected between an output terminal of a boosting circuit 1 and a ground Vss cannot attain a sufficient function when the high voltage Vpp is greatly changed.

A technique has been proposed to deal with such a large change in the supply voltage Vcc as stated above, and in accordance with this technique, zener diodes ZD1 and ZD2 are connected in parallel between a source and an emitter of a bipolar transistor, so that an excessive current is bypassed through a current path of the bipolar transistor. However, since a base current flows and makes it difficult to control currents when a bipolar transistor is used, it is difficult to sufficiently reduces changes in the output current Ipp. In case where a high voltage generator circuit which generates a negative voltage is used, changes in the output current Ipp cannot be controlled by use of a bipolar transistor. Further, in case of a semiconductor device using a MOS transistor as its main component, such as an EEPROM, incorporation of a bipolar transistor into the semiconductor device will complicate the manufacturing process, and therefore, application of a bipolar transistor into a MOS transistor is difficult.

As has been explained above, in a conventional high voltage generator circuit as shown in FIGS. 1 and 2, an output voltage of a boosting circuit depends on a supply voltage and is therefore easily changed in accordance with changes in the supply voltage. In addition, a limiter circuit of a conventional high voltage generator circuit cannot supply a stable output voltage or output current, since a zener voltage is easily changed due to variance of manufacturing process. These are factors which render erasing- or writing-characteristics of a memory unstable, in a non-volatile semiconductor memory using the high voltage generator circuit stated above.

SUMMARY OF THE INVENTION

An object of the present invention is therefore to provide a high voltage generator circuit which outputs a stable voltage independently from a supply voltage.

Another object of the present invention is to provide a high voltage generator circuit which outputs a stable voltage without being much influenced by production variance due to manufacturing process.

Further another object of the present invention is to provide a high voltage generator circuit which stabilizes erasing- or writing-characteristics when included in a non-volatile semiconductor memory.

The above objects are achieved by a high voltage generator circuit comprising: a boosting circuit for boosting a supply voltage; a limiter circuit for limiting an output voltage of the boosting circuit; and a bypass circuit for bypassing an excessive component of an output current of the boosting circuit which exceeds a reference value, when the output voltage of the boosting circuit exceeds a limit voltage of the limiter circuit and when the output current thereof is simultaneously increased to be higher than the reference value.

In the arrangement as stated above, the limiter circuit operates when an output voltage of the boosting circuit exceeds the limit voltage of the limiter circuit, so that the output voltage is maintained to be constant. In addition, when the output voltage of the boosting circuit exceeds the limit voltage of the limiter circuit and an output current of the boosting circuit simultaneously exceeds a reference value, an excessive component of the output current of the boasting circuit which exceeds a predetermined value is bypassed and flows out from the ground. The output current can thus be stabilized. Consequently, it is possible to active a high voltage generator circuit which outputs a stable voltage independently from a supply voltage and a stable current which is not easily influenced by production variance of manufacturing process.

Since the output voltage and current of the high voltage generator circuit are thus maintained to be constant, erasing or writing characteristics can be stabilized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a block diagram schematically showing an arrangement of a high voltage generator circuit according to the first embodiment of the present invention;

FIG. 7 is a circuit diagram specifically showing an example of an arrangement of the high voltage generator circuit shown in FIG. 6;

FIG. 8 is a block diagram schematically showing an arrangement of a high voltage generator circuit according to the second embodiment of the present invention;

FIG. 10 is a circuit diagram showing an example of an arrangement of a differential amplifier in the circuit shown in FIG. 9;

FIG. 12 is a circuit diagram showing another example of an arrangement of the constant current circuit shown in FIGS. 7, 9, and 11;

FIG. 13 is a circuit diagram showing further another example of an arrangement of the constant current circuit shown in FIGS. 7, 9, and 11.

DETAILED DESCRIPTION OF THE PREFERRED EMBODIMENTS

FIG. 6 is a block diagram schematically showing an arrangement of a high voltage generator circuit according to the first embodiment of the present invention. This high voltage generator circuit is included in a non-volatile semiconductor memory, e.g., a chip of a flash EEPROM. The high voltage generator circuit comprises a boosting circuit 1, a limiter circuit 2, and a bypass circuit 10. When a supply voltage Vcc of 5 V is applied to the boosting circuit 1, the voltage Vcc is boosted to generate, for example, a high voltage Vpp of 20 V, which is supplied to the limiter circuit 2. When the limiter circuit 2 is operated and an output current Ipp of the limiter circuit exceeds a reference value, the bypass circuit 10 is driven so that the output current of the limiter circuit 2 is bypassed and extracted to the outside through a ground Vss.

In the above arrangement, when a high voltage Vpp outputted from the boosting circuit 1 exceeds a limit voltage of the limiter circuit 2, the limiter circuit 2 operates so that the output voltage Vpp is maintained to be constant. When the limiter circuit 2 thus operates and an output current Ipp exceeds a reference value, the bypass circuit 10 operates so that an excessive component of the output current Ipp which exceeds the reference value is lead to the ground Vss.

Figure 1:
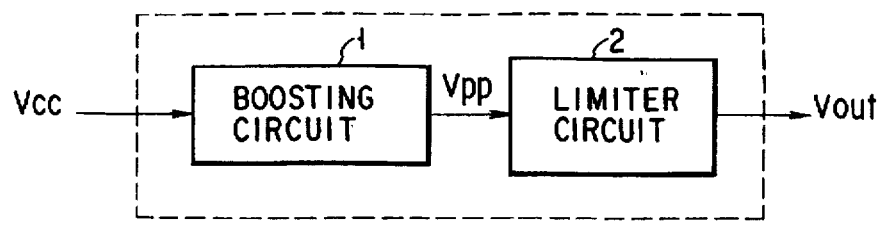
FIG. 1 is a block diagram schematically showing an arrangement of a conventional high voltage generator circuit included in a semiconductor device operated with a single power supply.
Figure 2:
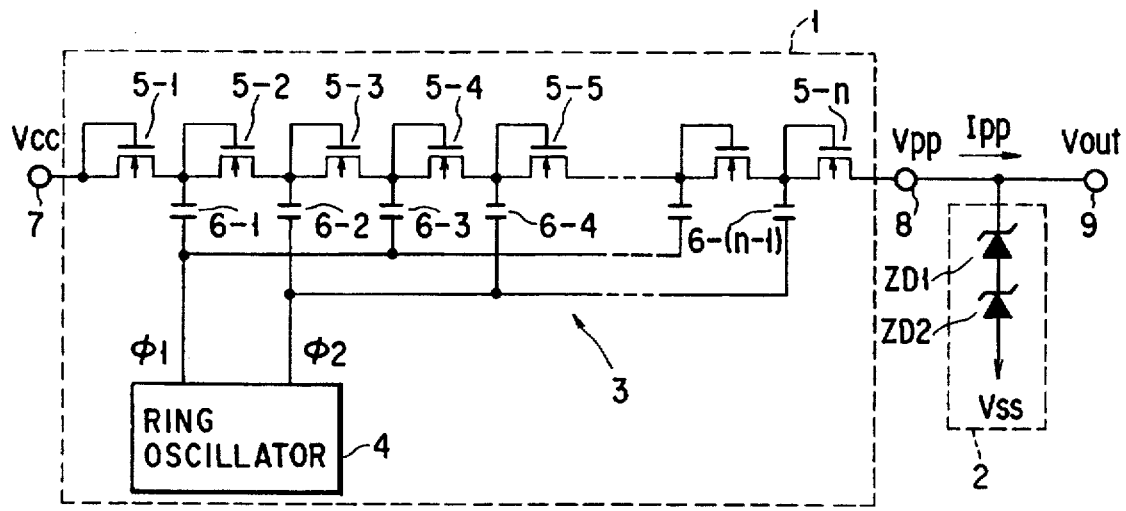
FIG. 2 is a circuit diagram specification showing an example of the arrangement of the high voltage generator circuit of FIG. 1.
Figure 3:
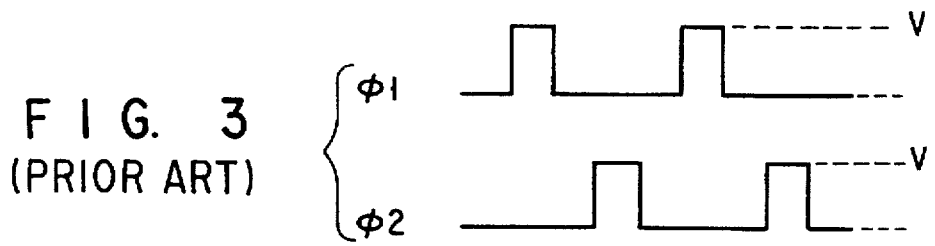
FIG. 3 is a diagram showing waveforms of clock pulses outputted from a ring oscillator of the circuit shown in FIG. 2.
Figure 4:
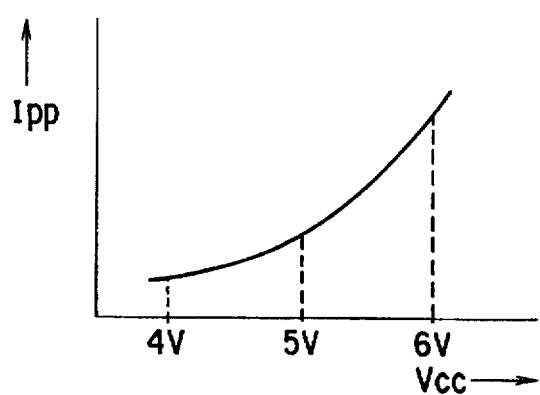
FIG. 4 is a voltage-current characteristic diagram showing a relationship between a supply voltage and a charge pump current.

The above-mentioned circuit shown in FIG. 6 will be specifically explained below, with reference to FIG. 7. FIG. 7 shows a specific example of an arrangement of the circuit shown in FIG. 6. A boosting circuit 1 comprises a charge pump circuit 3 and a ring oscillator 4 as in the circuit shown in FIG. 2. The charge pump circuit 3 includes N-channel MOS transistors 5-1 to 5-n and capacitors 6-1 to 6-(n−1), and the drain and gate of each of these transistors are connected with each other. The MOS transistors 5-1 to 5-n are connected in series with each other to form a serial current path. The gate and drain of the MOS transistor 5-1 is connected to a terminal to which a supply voltage Vcc is applied, while the source of the MOS transistor 5-n is connected to a terminal 8 from which a boosted voltage Vpp is outputted. Connection points of the MOS transistors 5-1 to 5-n formed on the current path are respectively connected with electrodes of the capacitors 6-1 to 6-(n−1). The other electrodes of the capacitors 6-1, 6-3, . . . , are supplied with a clock pulse φ1 shown in FIG. 3 outputted from the ring oscillator 4, while the other electrodes of the capacitors 6-2, 6-4, . . . , are supplied with a clock pulse φ2 also shown in FIG. 3 from the ring oscillator 4. Charges are thus sequentially transferred in synchronization with the clock pulses φ1 and φ2, and a high voltage vpp is outputted to the terminal 8 by a charge pump.

A cathode of a Zener diode DZ1 is connected to the terminal 8, while an anode of the Zener diode DZ1 is connected to a cathode of another Zener diode DZ2. A current path of an depletion-type N-channel MOS transistor 11 is connected between an anode of the Zener diode DZ2 and a ground Vss, and a gate of the transistor 11 is connected to the ground Vss. The Zener diodes DZ1 and DZ2 and the MOS transistor 11 stated above serve as a limiter circuit 2. The Zener diodes DZ1 and DZ2 have a function of setting a limit voltage, while the MOS transistor 11 serves as a constant current source. Zener voltages of the Zener diodes DZ1 and DZ2 are each of 5 to 10 V. The Zener diodes DZ1 and DZ2 may be substituted with other kinds of diodes. In case of using diodes, it is possible to use a break-down voltage of diodes by connecting them in a reverse direction between the output end of the boosting circuit 1 and a constant current source (e.g., the MOS transistor 11 in FIG. 11), as in the case of using the Zener diodes. Otherwise, it is possible to use a voltage drop in a forward direction by connecting the diodes in the forward direction. In the case of thus connecting diodes in the forward direction, diodes can be arranged such that temperature characteristics thereof may be used to effect a temperature compensation. The total number of Zener diodes or other kinds of diodes is determined in accordance with a high voltage Vpp, a break-down voltage, and the like. A limiter circuit having an arrangement of a MOS transistor or a combination of MOS transistors may be used.

A depletion-type N-channel MOS transistor 12 and an enhancement-type N-channel MOS transistor 13, which serve as a bypass circuit, are connected in series between the terminal 8 and the ground Vss stated above to form a serial current path. A gate of the MOS transistor 12 is connected to a power supply Vcc, while a gate of the MOS transistor 13 is connected to a connection point (or an node N1) connecting the anode of the Zener diode ZD2 with the MOS transistor 11. When an increase in the current flowing through the limiter circuit 2 is detected by the MOS transistor 13 while the limiter circuit 2 operates (i.e., while the Zener diodes DZ1 and DZ2 are broken down), the MOS transistor 13 is turned on and leads an excessive component of the output current Ipp to the ground Vss (please note that the MOS transistor 12 is normally turned on). In this manner, the output current Ipp is controlled to be constant. Note that the MOS transistor 12 is provided as a protective means for preventing an excessively high voltage from being applied to the drain of the MOS transistor 13, and therefore, the bypass circuit 2 regularly operates without the MOS transistor 13.

Figure 5:
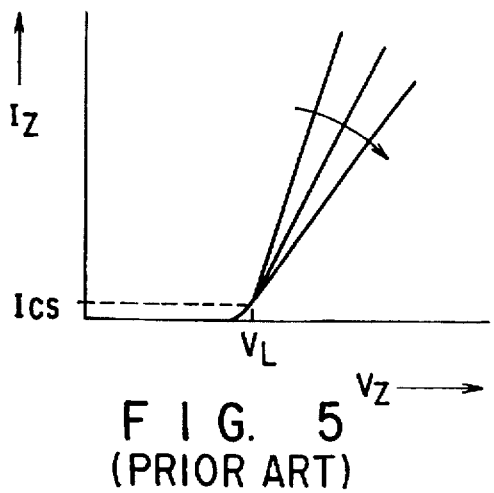
FIG. 5 is voltage-current characteristic diagram showing a relationship between a voltage applied to a cathode of a Zener diode and a current flowing through the Zener diode.

In the arrangement as stated above, when the output current Ipp is smaller than the current Ics flowing through the current path of the MOS transistor 11 which serves as a constant current source, a gate potential $V_{N1}$ (i.e., a potential of the node N1) of the MOS transistor 13 is much lower than the threshold voltage Vth of the MOS transistor, so that the MOS transistor 13 is turned off. On the other hand, when the output current Ipp is larger than the current Ics, the potential $V_{N1}$ of the node N1 rapidly increases and the MOS transistor 13 is turned on. Consequently, excessive components of the output current Ipp which exceed a predetermined current value (i.e., a reference value) Ics are all fed out to the ground Vss through current paths of the MOS transistors 12 and 13. Therefore, the current flowing through the Zener diodes DZ1 and DZ2 is fixed to a constant current value Ics having a voltage-current characteristic as shown in FIG. 5, and the voltage is fixed to a value of VL while the current is thus fixed. In addition, if the current value Ics can be maintained to be sufficiently low, resistance components of the Zener diodes DZ1 and DZ2 are negligible while they are broken down. Therefore, influences of production variance of the manufacturing process which may otherwise incur changes in the current flowing through the Zener diodes DZ1 and DZ2 can be suppressed.

In the arrangement as stated above, a stable voltage which is independent from a supply voltage can be outputted with use of only a small number of components, and a stable current which is not easily influenced by production variance of manufacturing process can also be outputted. In addition, if the high voltage generator circuit shown in FIG. 7 is included in a non-volatile semiconductor memory, erasing- and writing-characteristics are stabilized. However, in the circuit arrangement shown in FIG. 7, since the current Ip flowing through the bypass circuit 10 is proportional to a square of the potential VN1 of the node N1, dependency of the output voltage Vpp onto the supply voltage Vcc cannot completely be removed as long as the potential VN1 of the node N1 changes.

FIG. 8 is a block diagram schematically showing an arrangement of a high voltage generator circuit according to the second embodiment of the present invention. This high voltage generator circuit is obtained by improving the circuit shown in FIGS. 6 and 7 so that the dependency of the output voltage Vpp onto the supply voltage Vcc is lowered. The circuit shown in FIG. 8 is included in, for example, a chip of a flash EEPROM, like the circuit shown in FIGS. 6 and 7. This high voltage generator circuit comprises a boosting circuit 1, a limiter circuit 2, a bypass circuit 10, and a voltage detection circuit 14. When a supply voltage vcc of, for example, 5 V is applied into the boosting circuit 1, a high voltage Vpp of, for example, 20 V is generated and supplied to the limiter circuit 2. A voltage corresponding to a current flowing through the limiter circuit 2 while this limiter circuit 2 is operating is supplied to a voltage detection circuit 14 and is detected thereby. In accordance with the detection results, the bypass circuit 10 is driven. An excessive portion of an output current Ipp is thereby discharged to a ground Vss.

Figure 9:
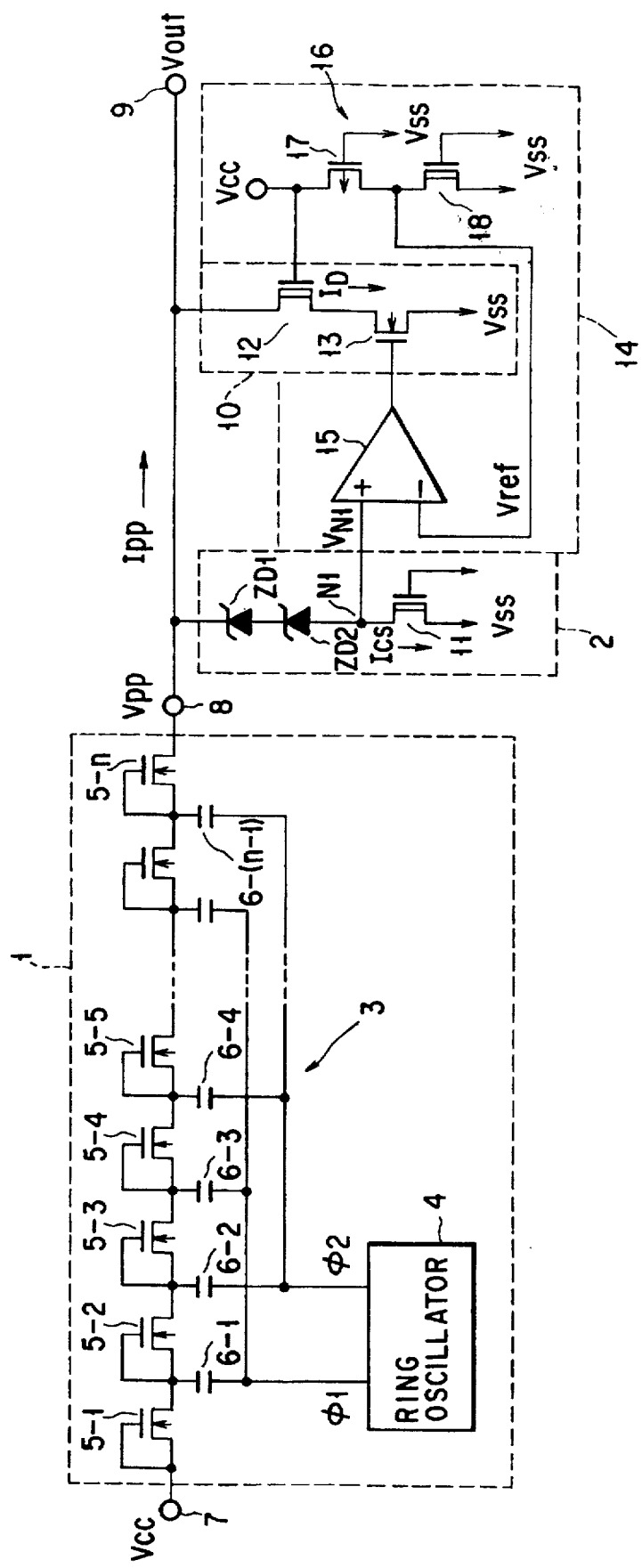
FIG. 9 is a circuit diagram specifically showing an example of an arrangement of the high voltage generator circuit shown in FIG. 8.

FIG. 9 shows an example of a specific arrangement of the circuit shown in FIG. 8, in which a differential amplifier 15 and a reference potential generator circuit 16 are added as a voltage detection circuit 14 to the circuit shown in FIG. 7. More Specifically, a noninverting input terminal (+) of the differential amplifier 15 is connected to a node N1, and an inverting input terminal (−) thereof is connected to an output terminal of the reference potential generator circuit 16, which is connected to a gate of a MOS transistor 13. The reference potential generator circuit 16 stated above having a P-channel MOS transistor 17 and an N-channel MOS transistor 18 of a depletion type. The MOS transistors 17 and 18 are connected in series between a power supply Vcc and a ground Vss to form a serial current path. Gates of these MOS transistors 17 and 18 are connected to the ground Vss. The MOS transistor 17 serves as a load, while the MOS transistor 18 serves as a constant current source. A connection point connecting the MOS transistors 17 and 18 with each other, i.e., the output terminal of the reference potential generator circuit 16 is connected with the inverting input terminal (−) of the differential amplifier 15. A supply voltage vcc is divided by the MOS transistors 17 and 18, thereby to generate a reference potential Vref which is applied to the inverting input terminal (−) of the differential amplifier 15. Preferably, the value of a current which flows when Zener diodes ZD1 and ZD2 are broken down is sufficiently low.

FIG. 10 shows an example of an arrangement of the differential amplifier 15 in the circuit shown in FIG. 9. This differential amplifier 15 having P-channel type MOS transistors 19 and 20 and N-channel MOS transistors 21 and 22. A source of the MOS transistor 19 is connected to the power supply vcc, and a gate thereof is connected to a node N1. A source of the MOS transistor 20 is connected to the power supply Vcc, and a gate thereof is connected to an output end of a reference potential generator circuit 16. MOS transistors 21 and 22 which constitute a current mirror circuit arrangement are connected between drains of the MOS transistors 19 and 20 and the ground Vss. A connection point common to the drains of MOS transistors 20 and 22 is connected to a gate of the MOS transistor 13. P-channel MOS transistors 19 and 20 are thus used on an input stage because the differential amplifier 15 must be operated within a range equal to or lower than the supply voltage Vcc and close to the ground potential Vss, where a high sensitivity is required.

In the circuit arrangement shown in FIG. 9, when an output voltage Vpp of the boosting circuit 1 cannot be boosted to a desired value and a potential $V_{N1}$ inputted to the non-inverting input terminal (+) of the differential amplifier 15 is lower than the reference potential Vref inputted to the inverting input terminal (−) thereof, an output voltage of the differential amplifier 15 is decreased to be sufficiently lower than a threshold voltage of the MOS transistor 13. Therefore, the MOS transistor 13 is turned off. On the other hand, when the output voltage Vpp of the boosting circuit is boosted to a desired voltage, the potential $V_{N1}$ inputted to the non-inverting input terminal (+) of the differential amplifier 15 is increased to be higher than the reference potential Vref inputted to the inverting input terminal (−), and a current Ics flowing through the MOS transistor 11 is increased to be higher than a current flowing through the MOS transistor 18, the output of the differential amplifier is increased to a high level. The MOS transistor 13 is thereby turned on and a current Ipp flows from a terminal 8 through the current path of MOS transistors 12 and 13 to the ground Vss. Thus, an excessive component of the output current Ipp which exceeds a predetermined current value Ics is discharged to the ground Vss. The current flowing through the limiter circuit 2 can be maintained to be constant in this manner. As a result, the output voltage Vpp can be maintained to be constant, independently from the output current Ipp thereof.

If the arrangement shown in FIG. 10 is adopted as a differential amplifier 15, the amplifier can be used within a range equal to or lower than the supply voltage Vcc where the amplifier exhibits a high sensitivity, and the output voltage of the differential amplifier 15 is approximately equal to the threshold voltage of the MoS transistor 13 and is therefore lower than the supply voltage Vcc. Thus, the differential amplifier 15 operates within an operation range equal to or lower than the supply voltage, and the circuit arrangement does not require components having a high withstand voltage. The circuit can be constituted by components occupying only a small area and having a high performance. In addition, the voltage detection ability ensured by the circuit arrangement shown in FIG. 9 is superior to that of the circuit arrangement shown in FIG. 7, and a response time period required after the detection until the MOS transistor is turned on can be shortened. Further, since the reference potential generator circuit 16 generates a reference potential Vref by using a supply voltage Vcc, the circuit arrangement is advantageously simple. If a plurality of differential amplifiers 15 as shown in FIG. 10 are connected and used for a plurality of stages, for example, two stages, the sensitivity of the entire differential amplifiers can be much more improved than that obtained by single use.

Figure 11:
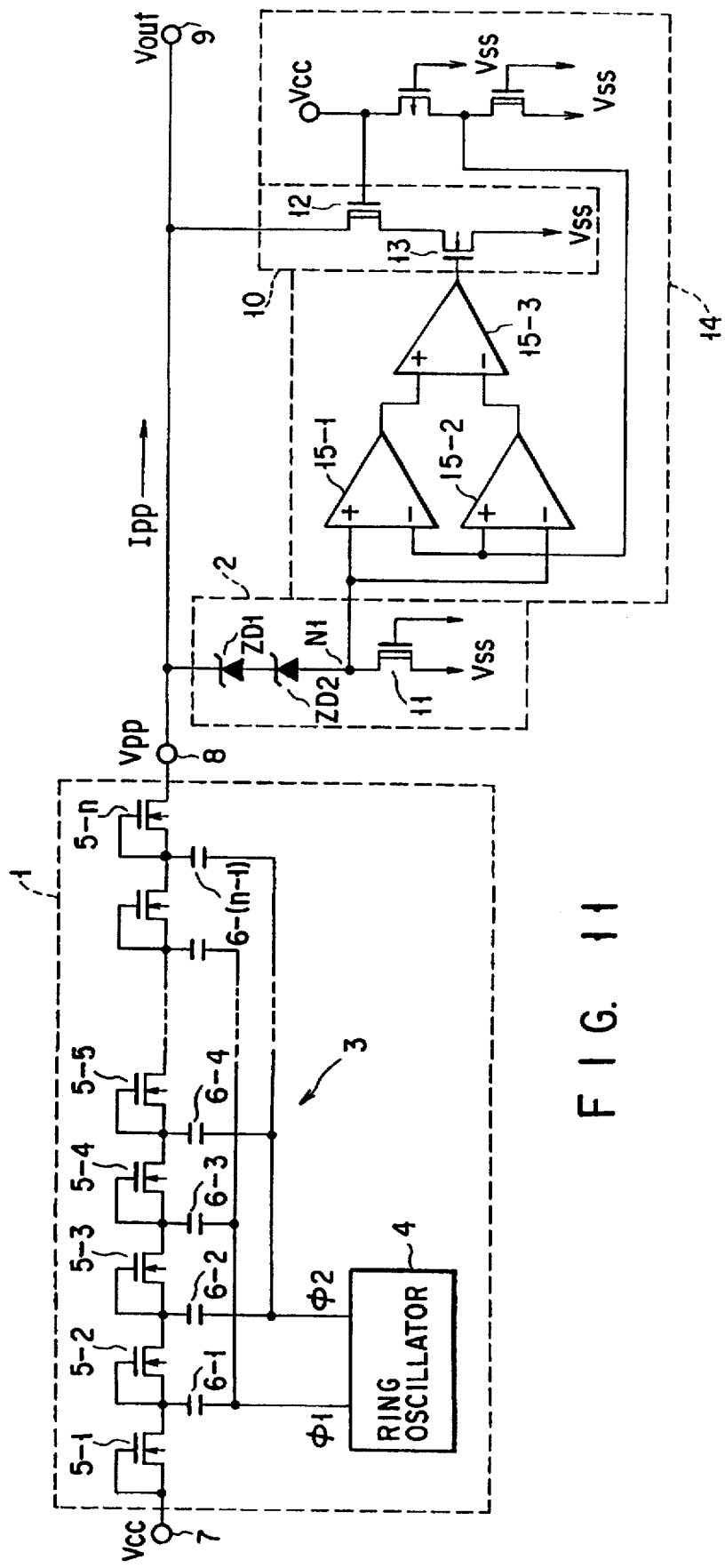
FIG. 11 is a circuit diagram showing another example of an arrangement of the high voltage generator circuit shown in FIG. 8.

FIG. 11 specifically shows another example of an arrangement of the high voltage generator circuit shown in FIG. 8. In the circuit shown in FIG. 11, three differential amplifiers 15-1, 15-2, and 15-3 are used. A non-inverting input terminal (+) of the differential amplifier 15-1 and an inverting input terminal (−) of the differential amplifier 15-2 are connected to an node N1. An inverting input terminal (−) of the differential amplifier 15-1 and an non-inverting input terminal (+) are connected to an output terminals of a reference potential generator circuit 16. output terminals of the differential amplifiers 15-1 and 15-2 are respectively connected to a non-inverting input terminal (+) and an inverting input terminal (−) of the differential amplifier 15-3. An output terminal of the differential amplifier 15-3 is connected to a gate of a MOS transistor 13.

In the arrangement shown in FIG. 11, the differential amplifiers 15-1 and 15-2 amplify a potential difference between a potential of the node N1 and a reference potential Vref in opposite directions, respectively. The amplification result is further amplified by the differential amplifier 15-3. Therefore, even when the potential difference between the potential of the node N1 and the reference potential Vref is extremely small, the MOS transistor 13 can be driven. As a result, an output current Ipp can be stabilized with a higher accuracy than that of the circuit shown in FIG. 9.

FIG. 12 illustrates an example of a variation of the circuits shown in FIGS. 7, 9, and 11, i.e., an example of an arrangement of a constant current source. Although the circuits shown in FIGS. 7, 9, and 11 use a MOS transistor 1 of a depletion type as a current source, an N-channel MOS transistor 23 of an enhancement type may be used as a current source, as shown in FIG. 12. In this case, load elements 24 and 25 which may be resistors are used to divide a supply voltage Vcc, and a divided voltage is applied to a gate of the MOS transistor 23. The MOS transistor 23 is thus operated within a region of a pentode, and functions as a constant current source.

Further, as shown in FIG. 13, a resistor 25 may be used to approximate a constant current source in place of the MOS transistor 11 stated above. If the resistor 25 is formed of an impurity diffusion layer, the resistor occupies a large area or is easily influenced by a bias of a substrate. However, a resistor 25 which occupies only a small area and is not influenced by a bias of a substrate can be obtained by a method in which a polysilicon layer or an amorphous silicon layer is formed on an insulating film and the density of impurities is then controlled to define a resistance value.

With respect to each of the above embodiments, explanation has been made to those cases in which a positive supply voltage Vcc is boosted to generate a positive high voltage Vpp (i.e., an output voltage Vout). On the other hand, a high voltage generator circuit for a negative voltage can be constituted by replacing the N-channel MOS transistors of the above embodiments with P-channel MOS transistors and by replacing the P-channel MOS transistors with N-channel MOS transistors.

Figure 14:
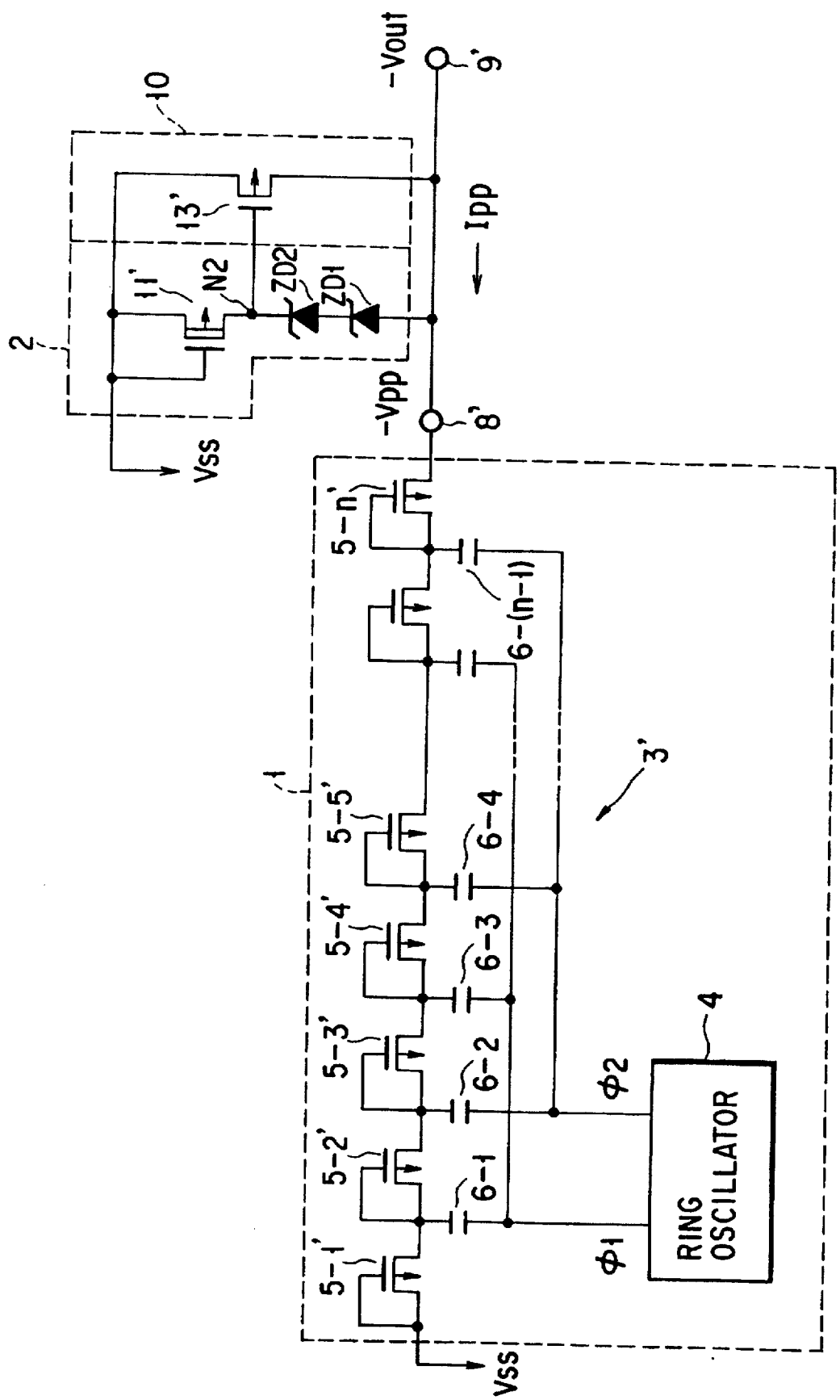
FIG. 14 is a circuit diagram showing another example of an arrangement of the high voltage generator circuit shown in FIG. 6.

FIG. 14 shows an example of a specific arrangement of the circuit shown in FIG. 6, and shows a high voltage generator circuit for generating a high voltage. In this circuit, a charge pump circuit 3' includes P-channel MOS transistors 5-1' to 5-n' and capacitors 6-1 to 6-(n−1), and sources and gates of the transistors are connected with each other. The above MOS transistors are connected in series to form a serial current path, and the gate and source of the MOS transistor 5-1' are connected to a ground Vss while a drain of the MOS transistor 5-n' is connected to a terminal 8' for outputting a boosted voltage −Vpp. Connection points connecting the MOS transistors 5-1' to 5-n' with each other on the current path are respectively connected with electrodes of the capacitors 6-1 to 6-(n−1). A clock pulse φ1 outputted from a ring oscillator 4 is supplied to the other electrodes of the capacitors 6-1, 6-3, ... A clock pulse φ2 is supplied to the other electrodes of the capacitors 6-2, 6-4, ...

Charges are sequentially transferred to the ground Vss in synchronization with clock pulses φ1 and φ2, and a potential of the terminal 8' is decreased by the charge pump, thereby to generate a negative high voltage −Vpp.

The above terminal 8' is connected with an anode of a Zener diode DZ1. A cathode of the Zener diode DZ1 is connected with anode of another zener diode DZ2. A current path of a P-channel MOS transistor 11' of a depletion type is connected between a cathode of the Zener diode DZ2 and the ground Vss. A gate of the MOS transistor 11' is connected to the ground Vss. This MOS transistor 11' functions as a constant current source.

A current path of a P-channel MOS transistor 13' is connected between the terminal 8' and the ground Vss. The MOS transistor 13' has a gate connected to a connection point (i.e., a node N2) between the cathode of the Zener diode DZ2 and the MOS transistor 11'. The above MOS transistor 13' serves as a bypass circuit 10.

Basic operations, functions, and effects of the circuit shown in FIG. 14 are the same as those of the circuit shown in FIG. 7.

It is said that demands for a non-volatile semiconductor memory in which both of positive and negative high voltages are generated in a semiconductor chip will be found in much more cases in the future, as the integration of a semiconductor proceeds. These demands can be satisfied if a high voltage generator circuit having an arrangement as shown in FIG. 14 is combined with a high voltage generator circuits as shown in FIGS. 7, 9, and 11, since both of positive and negative high voltages are generated by this combination. In the same manner, a negative high voltage generator circuit may be constituted by replacing the P-channel MOS transistors of the circuits shown in FIGS. 9 and 11 with N-channel MOS transistors.

Although the above embodiments have been specified with reference to examples of a high voltage generator circuit included in a chip of a flash EEPROM, it is needless to say that these embodiments are applicable to other types of semiconductor integrated circuit devices. In addition, although a boosting circuit of the embodiments is constituted by a charge pump and a ring oscillator, the boosting circuit may have a different arrangement other than those of the embodiments. The above embodiments have also been explained with reference to examples in which a boosting circuit includes a ring oscillator. However, it is possible to use clock pulses supplied from an external device outside the semiconductor chip.

Additional advantages and modifications will readily occur to those skilled in the art. Therefore, the invention in its broader aspects is not limited to the specific details, and representative materials, described herein. Accordingly, various modifications may be made without departing from the spirit or scope of the general inventive concept as defined by the appended claims and their equivalents.

What is claimed is:

1. A high voltage generator circuit comprising:
   a boosting circuit for boosting a supply voltage;
   a limiter circuit for limiting an output voltage of said booster circuit, said limiter circuit providing an internal potential; and
   a bypass circuit responsive to the internal potential provided by said limiter circuit for bypassing a current component of an output current of said boosting circuit,
   wherein said bypass circuit includes a switching circuit which turns on in response to said internal potential received at a control terminal thereof.

2. A high voltage generator circuit according to claim 1, wherein said boosting circuit includes a charge pump circuit supplied with the supply voltage.

3. A high voltage generator circuit according to claim 2, wherein said boosting circuit further includes a ring oscillator for generating a clock for driving the charge pump circuit.

4. A high voltage generator circuit according to claim 1, wherein said limiter circuit includes at least one Zener diode having a cathode connected with an output terminal of said boosting circuit, and a load circuit connected between an anode of said Zener diode and a second supply voltage, and said bypass circuit is controlled in response to a potential of a connection point connecting said load circuit and said anode of said at least one Zener diode.

5. A high voltage generator circuit according to claim 4, wherein said load circuit includes a constant current source.

6. A high voltage generator circuit according to claim 5, wherein said constant current source includes a MOS transistor of a depletion type having a current path connected between the second supply voltage and said anode of the at least one Zener diode, and having a gate connected to the second supply voltage.

7. A high voltage generator circuit according to claim 4, wherein said load circuit includes a MOS transistor having a current path connected between the second supply voltage and said anode of said at least one Zener diode, a first resistor connected between a gate of said MOS transistor and a power supply, and a second resistor connected between said gate of said MOS transistor and the second supply voltage.

8. A high voltage generator circuit according to claim 4, wherein said load circuit includes at least one resistor connected between said anode of said at least one Zener diode and the second supply voltage.

9. A high voltage generator circuit according to claim 1, wherein said switching circuit has a first MOS transistor having a current path connected between an output terminal of said boosting circuit and a second supply voltage, and a gate connected to said limiter circuit.

10. A high voltage generator circuit according to claim 9, wherein said switching circuit further includes a second MOS transistor of a depletion type having a current path connected between said first MOS transistor and said output terminal of said boosting circuit, and a gate connected to the supply voltage.

11. A high voltage generator circuit comprising:
a boosting circuit for boosting a supply voltage;
a limiter circuit for limiting an output voltage of said booster circuit, said limiter circuit providing an internal potential;
a bypass circuit for bypassing a current component of an output current of said boosting circuit;
a reference potential generator for generating a reference potential; and
a voltage comparing circuit for comparing the internal potential provided by said limiter circuit with the reference potential outputted from said reference potential generator and for controlling the bypass circuit in response to a comparison result.

12. A high voltage generator circuit according to claim 11, wherein the voltage comparing circuit includes a differential amplifier having a non-inverting input terminal connected to the limiter circuit, an inverting input terminal connected to an output terminal of the reference potential generator, and an output terminal connected to the bypass circuit.

13. A high voltage generator circuit according to claim 12, wherein said differential amplifier includes a first MOS transistor of a P-channel type having a source connected to the supply voltage and a gate connected to said limiter circuit, a second MOS transistor of a P-channel type having a source connected to the supply voltage and a gate connected to said output terminal of said reference potential generator, a third MOS transistor of an N-channel type having a drain and gate both connected to a drain of said first MOS transistor, and a fourth MOS transistor of an N-channel type having a drain connected to a drain of said second MOS transistor and a gate connected to a gate of said third MOS transistor, wherein said drains of said second and fourth MOS transistors being connected to said bypass circuit.

14. A high voltage generator circuit according to claim 12, wherein said switching circuit has a first MOS transistor having a current path connected between an output terminal of said boosting circuit and a second supply voltage, and a gate connected to said output terminal of said differential amplifier.

15. A high voltage generator circuit according to claim 14, wherein said switching circuit further includes a second MOS transistor of a depletion type having a current path connected between said first MOS transistor and said output terminal of said boosting circuit, and a gate connected to the supply voltage.

16. A high voltage generator circuit according to claim 11, wherein the voltage comparing circuit includes a first differential amplifier having a non-inverting input terminal connected to the limiter circuit and an inverting input terminal connected to an output terminal of the reference potential generator, a second differential amplifier having an inverting input terminal connected to the limiter circuit and a non-inverting input terminal connected to the output terminal of the reference potential generator, and a third differential amplifier having a non-inverting input terminal connected to an output terminal of the first differential amplifier, and an output terminal connected to the bypass circuit.

17. A high voltage generator circuit according to claim 16, wherein said switching circuit has a first MOS transistor having a current path connected between an output terminal of said boosting circuit and a second supply voltage, and a gate connected to said output terminal of said third differential amplifier.

18. A high voltage generator circuit according to claim 11, wherein said reference potential generator includes a load circuit connected to the supply voltage, and a constant current source connected between said load circuit and a second supply voltage, and a potential of a connection point connecting said load circuit with said constant current source is supplied as said reference potential to said voltage comparing circuit.

19. A high voltage generator circuit comprising:
a boosting circuit for boosting a first supply voltage;
a limiter circuit for limiting an output voltage of said boosting circuit and providing an internal potential, said limiter circuit connected between an output of said boosting circuit and a second supply voltage; and
a bypass circuit connected between said output of said boosting circuit and said second supply voltage for bypassing a current component of an output current of said boosting circuit,
wherein said bypass circuit includes a switching circuit which turns on in response to said internal potential received at a control terminal thereof.

20. A high voltage generator circuit according to claim 19, wherein said boosting circuit includes a charge pump circuit supplied with the supply voltage.

21. A high voltage generator circuit according to claim 20, wherein said boosting circuit further includes a ring oscillator for generating a clock for driving said charge pump circuit.

22. A high voltage generator circuit according to claim 19, wherein said limiter circuit includes at least one Zener diode having a cathode connected with an output terminal of said boosting circuit, and a load circuit connected between an anode of said Zener diode and a second supply voltage, and said bypass circuit is controlled in response to a potential of a connection point connecting said load circuit and said anode of said at least one Zener diode.

23. A high voltage generator circuit according to claim 22, wherein said load circuit includes a constant current source.

24. A high voltage generator circuit according to claim 23, wherein said constant current source includes a MOS transistor of a depletion type having a current path connected between the second supply voltage and said anode of the at least one Zener diode, and having a gate connected to the second supply voltage.

25. A high voltage generator circuit according to claim 22, wherein said load circuit includes a MOS transistor having a current path connected between the second supply voltage and said anode of said at least one Zener diode, a first resistor connected between a gate of said MOS transistor and a power supply, and a second resistor connected between said gate of said MOS transistor and the second supply voltage.

26. A high voltage generator circuit according to claim 22, wherein said load circuit includes at least one resistor connected between said anode of said at least one Zener diode and the second supply voltage.

27. A high voltage generator circuit according to claim 19, wherein said switching circuit has a first MOS transistor having a current path connected between an output terminal of said boosting circuit and a second supply voltage, and a gate connected to said limiter circuit.

28. A high voltage generator circuit according to claim 27, wherein said switching circuit further includes a second MOS transistor of a depletion type having a current path connected between said first MOS transistor and said output terminal of said boosting circuit, and a gate connected to the supply voltage.

29. A high voltage generator circuit comprising:

a boosting circuit for boosting a first supply voltage;

a limiter circuit for limiting an output voltage of said booster circuit and providing an internal potential, said limiter circuit connected between an output of said boosting circuit and a second supply voltage;

a bypass circuit connected between said output of said boosting circuit and said second supply voltage for bypassing a current component of an output current of said boosting circuit;

a reference potential generator for generating a reference potential; and a voltage comparing circuit for comparing the internal potential provided by said limiter circuit with the reference potential outputted from said reference potential generator and for controlling the bypass circuit in response to a comparison result.

30. A high voltage generator circuit according to claim 29, wherein the voltage comparing circuit includes a differential amplifier having a non-inverting input terminal connected to the limiter circuit, an inverting input terminal connected to an output terminal of the reference potential generator, and an output terminal connected to the bypass circuit.

31. A high voltage generator circuit according to claim 30, wherein said differential amplifier includes a first MOS transistor of a P-channel type having a source connected to the supply voltage and a gate connected to said limiter circuit, a second MOS transistor of a P-channel type having a source connected to the supply voltage and a gate connected to said output terminal of said reference potential generator, a third MOS transistor of an N-channel type having a drain and gate both connected to a drain of said first MOS transistor, and a fourth MOS transistor of an N-channel type having a drain connected to a drain of said second MOS transistor and a gate connected to a gate of said third MOS transistor, wherein said drains of said second and fourth MOS transistors being connected to said bypass circuit.

32. A high voltage generator circuit according to claim 30, wherein said switching circuit has a first MOS transistor having a current path connected between an output terminal of said boosting circuit and a second supply voltage, and a gate connected to said output terminal of said differential amplifier.

33. A high voltage generator circuit according to claim 32, wherein said switching circuit further includes a second MOS transistor of a depletion type having a current path connected between said first MOS transistor and said output terminal of said boosting circuit, and a gate connected to the supply voltage.

34. A high voltage generator circuit according to claim 29, wherein the voltage comparing circuit includes a first differential amplifier having a non-inverting input terminal connected to the limiter circuit and an inverting input terminal connected to an output terminal of the reference potential generator, a second differential amplifier having an inverting input terminal connected to the limiter circuit and a non-inverting input terminal connected to the output terminal of the reference potential generator, and a third differential amplifier having a non-inverting input terminal connected to an output terminal of the first differential amplifier, and an output terminal connected to the bypass circuit.

35. A high voltage generator circuit according to claim 34, wherein said switching circuit has a first MOS transistor having a current path connected between an output terminal of said boosting circuit and a second supply voltage, and a gate connected to said output terminal of said third differential amplifier.

36. A high voltage generator circuit according to claim 29, wherein said reference potential generator circuit includes a load circuit connected to the supply voltage, and a constant current source connected between said load circuit and a second supply voltage, and a potential of a connection point connecting said load circuit with said constant current source is supplied as said reference potential to said voltage comparing circuit.

* * * * *